United States Patent [19]

Mitani et al.

[11] Patent Number: 4,983,532

[45] Date of Patent: Jan. 8, 1991

[54] PROCESS FOR FABRICATING HETEROJUNCTION BIPOLAR TRANSISTORS

[75] Inventors: Katsuhiko Mitani, Kokubunji; Tomonori Tanoue, Ebina; Chushirou Kusano, Tokorozawa; Susumu Takahashi, Tokyo; Masayoshi Saito, Kokubunji; Hiroshi Miyazaki, Fuchu; Fumio Murai, Tokyo, all of Japan

[73] Assignee: Hitachi, Ltd., Tokyo, Japan

[21] Appl. No.: 286,710

[22] Filed: Dec. 20, 1988

[30] Foreign Application Priority Data

Dec. 23, 1987 [JP] Japan ................... 62-324108

[51] Int. Cl.⁵ ............... H01L 21/265; H01L 21/331; H01L 21/441
[52] U.S. Cl. ......................... 437/31; 437/33; 437/192; 437/203; 437/909; 148/DIG. 10; 148/DIG. 11; 148/DIG. 72; 148/DIG. 100
[58] Field of Search ............... 437/31, 909, 917, 192, 437/32, 33, 203, 31; 357/34, 35, 23.4, 16, 43; 148/DIG. 10, DIG. 11, DIG. 72, DIG. 100

[56] References Cited

U.S. PATENT DOCUMENTS

| 4,641,420 | 2/1987 | Lee ................... 148/DIG. 19 |
| 4,720,908 | 1/1988 | Wills ................. 437/192 |

FOREIGN PATENT DOCUMENTS

| 0177246 | 4/1986 | European Pat. Off. .......... 357/16 |
| 3512841 | 12/1985 | Fed. Rep. of Germany ... 148/DIG. 10 |
| 0086818 | 4/1987 | Japan ............................ 437/203 |

OTHER PUBLICATIONS

Tauber et al., Silicon Processing for the VLSI Era, 1986, pp. 400–405.

Primary Examiner—Brian E. Hearn
Assistant Examiner—Tuan Nguyen
Attorney, Agent, or Firm—Antonelli, Terry, Stout & Kraus

[57] ABSTRACT

Microfabrication and large scale integration of a device can be realized by using a planar heterojunction bipolar transistor formed by a process comprising successively growing semiconductor layers serving as a subcollector, a collector, a base, and an emitter, respectively, through epitaxial growth on a compound semiconductor substrate in such a manner that at least one of the emitter junction and collector junction is a heterojunction, wherein a collector drawing-out metal layer is formed by the selective CVD method.

14 Claims, 7 Drawing Sheets

PROCESS FOR FABRICATING HETEROJUNCTION BIPOLAR TRANSISTORS

BACKGROUND OF THE INVENTION

The present invention relates to a fabrication process of a heterojunction bipolar transistor and more particularly to a process for fabrication a heterojunction bipolar transistor suitable for forming a planar structure.

A heterojunction bipolar transistor (HBT) wherein a compound semiconductor is used attracts attention as a next generation high speed device. FIG. 1 is a schematic cross-sectional view of a conventional mesa-type HBT. In general, the above-described device is fabricated as follows. An $n^+$-type GaAs subcollector layer 22, an n-type GaAs collector layer 23, a $p^+$-type GaAs base layer 24, an n-type AlGaAs emitter layer 25, and an $n^+$-type GaAs cap layer 26 are successively formed on a semiinsulating GaAs substrate 21 by the MBE method or the like, and the surface of each of the base layer 24 and the subcollector layer 22 is exposed by mesa etching to form electrodes 27, 28 and 29 respectively corresponding to an emitter, a base, and a collector, thereby completing the device.

The mesa-type HBT thus prepared, however, had a problem that the breaking of the wire due to the presence of unevennesses of the device makes the integration for the purpose of taking advantage of excellent current-driving force impossible. In order to eliminate this drawback, studies have been made on the fabrication of a device with a planar structure. The fabrication of such a device makes it necessary to draw out the base or collector electrode on the surface of the substrate. Ion implantation technique has been used for the formation of a conductive layer for this purpose. However, it is very difficult to convert a deep region ranging from the surface of the n-type AlGaAs emitter layer 25 to the $n^+$-type GaAs subcollector layer 22 including the $p^+$base layer 24 located therebetween into a highly doped $n^+$-type through ion implantation of n-type impurities. Even if it is possible to achieve this conversion, annealing at a high temperature after the ion implantation unfavorably exerts an adverse effect on the characteristics of the heterojunction interface formed by epitaxial growth.

A method of drawing out a collector electrode on the surface of the device without using the ion implantation technique is described in, e.g., Technical Report ED84-67 of the Institute of Electronics and Communication Engineers of Japan, pp. 39~46. In this method, a contact hole which reaches the $n^+$-type GaAs subcollector layer is formed by etching and a metal is then buried in this hole by the lift-off method to flatten the surface.

SUMMARY OF THE INVENTION

In the above-described flattening through burying a metal, it is difficult to fill a contact hole having a high aspect ratio (depth of hole/width of bottom surface of hole) with a metal over the whole surface of a wafer through evaporation of the metal. In general, there occurs an increase in the difficulty when the aspect ratio exceeds about 1, and the difficulty is further increased when the aspect ratio exceeds 2. This make it impossible to reduce the area of the collector electrode, which renders the above-described flattening technique unsuitable for the microfabrication and large scale integration of the device.

In the above-described lift-off method, the diameter of an opening of the photoresist applied on the substrate is smaller than that of the hole formed on the substrate, which unfavorably brings about the formation of a void between the metal buried by the evaporation and the wall on the side of the hole. The occurrence of this phenomenon is remarkable when the difference in level for burying exceeds 5,000 Å.

An object of the present invention is to provide a process for fabrication a heterojunction bipolar transistor having a planar structure suitable for the microfabrication and large scale integration of a device.

The above-described object can be attained by burying a metal for drawing out an electrode through selective chemical vapor deposition (CVD method) of the metal.

DETAILED DESCRIPTION OF THE PREFERRED EMBODIMENTS

Figure 1:
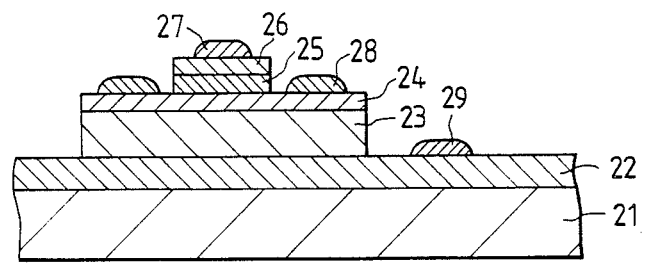
FIG. 1 is a cross-sectional view of a conventional mesa-type HBT structure.

When the selective chemical vapor deposition (CVD method) of a metal is used, the metal can be easily buried in a hole having a high aspect ratio, so that it becomes possible to reduce the area of the collector electrode. Therefore, this method can provide an HBT structure suitable for large scale integration.

EXAMPLE 1

The present invention will now be described in more detail with reference to the process diagram shown in FIG. 2.

An $n^+$-type GaAs subcollector layer 12 (thickness: 5000 Å), an n-type GaAs collector layer 13 (thickness: 6000 Å), a $p^+$-type GaAs base layer 14 (thickness: 1000 Å), an n-type AlGaAs layer 15 (thickness: 1000 Å), and an $n^+$-type GaAs cap layer 16 (thickness: 1000 Å) were successively grown on a semiinsulating GaAs substrate 11 by, e.g., the well-known MBE (molecular beam epitaxy) method. A SiN layer mask 17 corresponding to the emitter pattern was formed by making use of conventional CVD and lithography techniques [see FIG. 2(a)], and an unnecessary $n^+$-type GaAs cap layer 16 was removed by etching. Then, ion implantation of p-type impurities, such as Mg or Be, were conducted, and flash annealing was applied by making use of infrared rays to form a $p^+$-type external base layer 18 [see FIG. 2(b)].

Figure 2A:
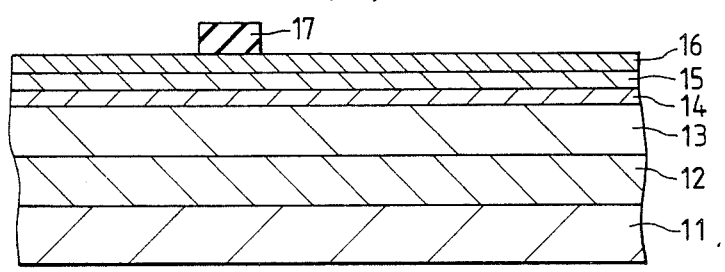
FIG. 2 is a schematic process diagram of Example 1.
Figure 2B:
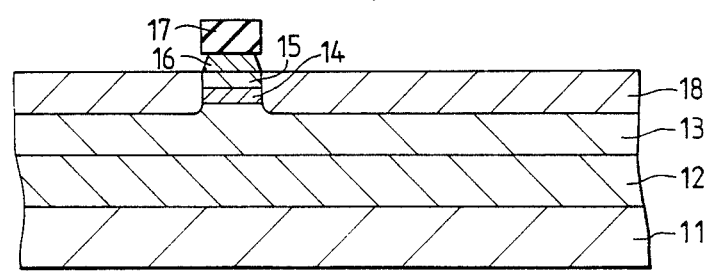
Figure 2C:
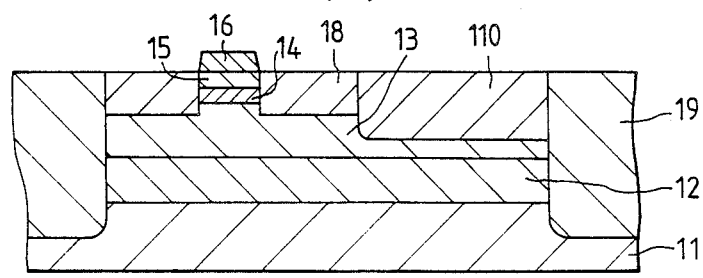
Figure 2D:
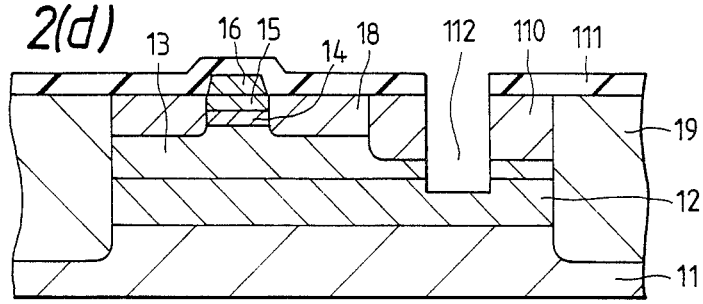
Figure 2E:
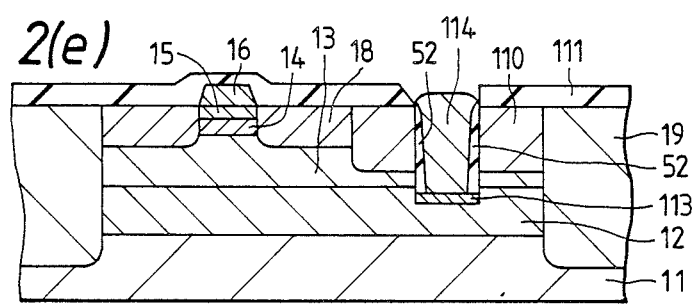

Then, a device isolation region 19 and a base-collector isolation region 110 were formed respectively through ion implantation of $H^+$ and $B^+$ by making use of a mask comprising a patterned photoresist [see FIG. 2(c)]. A SiO$_2$ layer 111 was applied thereon, and a mask pattern was formed by making use of a mask comprising a photoresist (not shown). Thereafter, a collector contact hole 112 was formed through the RIE (reactive ion etching) method by making use of a chlorine-base gas [see FIG. 2(d)]. A AuGe electrode and tungsten (500 Å) were successively deposited thereon by evaporation to form a AuGe electrode/ tungsten layer 113 only on the bottom of the collector contact hole 112 by the well-known lift-off method to form an alloy, thereby establishing ohmic contact with the n+-type GaAs subcollector layer 12. Subsequently, as shown in FIG. 5, a 3000 Å-thick SiO₂ layer 51 was applied to the GaAs layer 50 having a hole formed therein by the low pressure CVD method and then subjected to anisotropic etching by the well-known RIE method so that the side wall SiO₂ 52 remained unremoved. The collector contact hole 112 was completely filled with tungsten 114 through the selective CVD of tungsten by making use of WF₆ under conditions of a temperature during deposition of 400° C., a WF₆ gas flow rate of 20 sccm, a hydrogen flow rate of 2000 sccm, and a gas pressure of 0.75 Torr [see FIG. 2(e)].

Figure 2F:
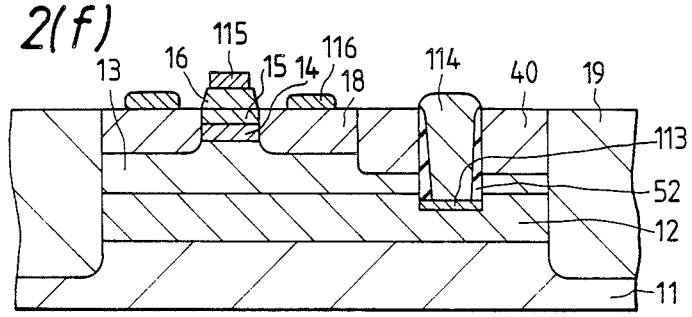
Figure 3A:
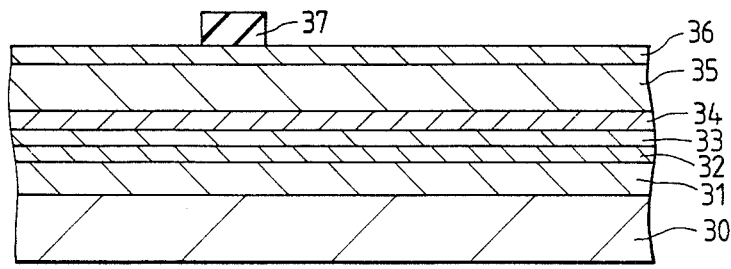
FIG. 3 is a schematic process diagram of Example 5.
Figure 3B:
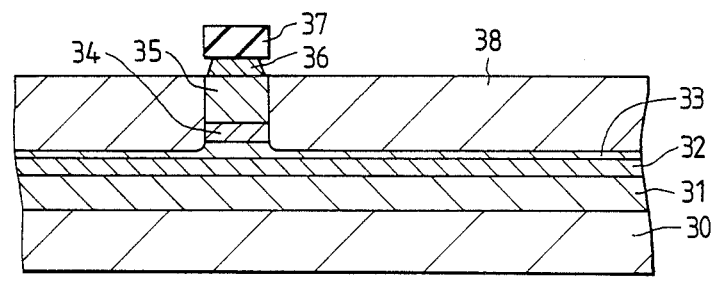
Figure 3C:
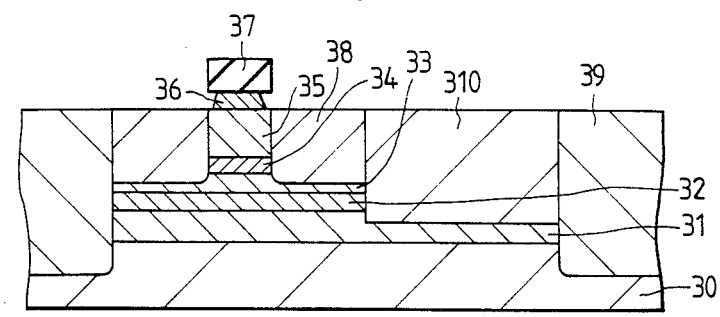
Figure 3D:
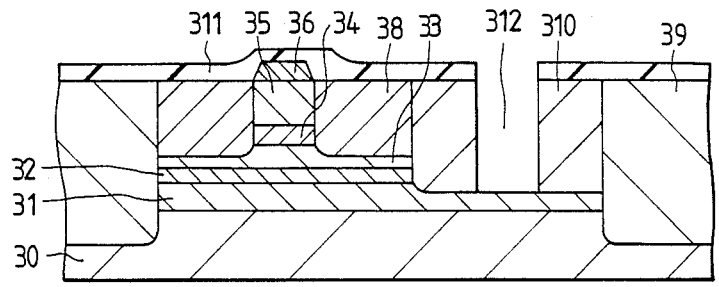
Figure 3E:
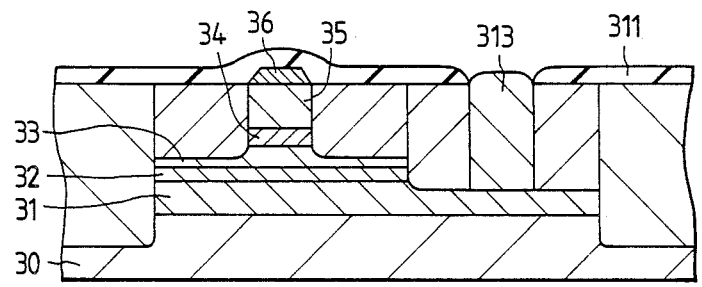
Figure 3F:
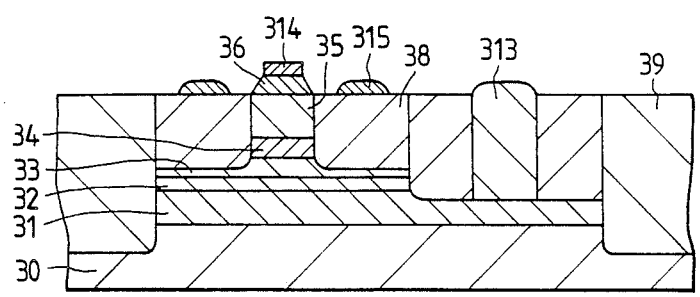

Thereafter, an emitter electrode 115 comprising AuGe and a base electrode 116 comprising AuZn were formed by a combination of usual lithography technique with the lift-off method [see FIG. 2(f)].

In the present Example, the burying of a metal in the contact hole 112 by the selective CVD method enabled tungsten 114 to be uniformly buried in the contact hole 112 having a high aspect ratio overall the wafer, so that not only it became possible to attain large scale integration but also the productivity and the reliability were remarkably improved. Although, in the present Example, AuGe was interposed between the metal for burying and the semiconductor layer to be contacted, the same effect can be attained even when other metals (e.g., tungsten, TiN, molybdenum, TiSi, or MoSi) are interposed depending upon the semiconductor layer.

In order to better form the tungsten layer on the AuGe electrode, it is desirable to form a thin tungsten layer previously on the AuGe electrode.

When forming the AuGe electrode at the bottom of the hole, the GaAs surface constituting the bottom of the hole around the AuGe electrode may be unfavorably exposed in some cases. It was found that the above-described phenomenon brought about a drawback that when a tungsten layer (thickness: 100 to 1000 Å) was formed on the AuGe electrode and a tungsten layer was further grown thereon by the selective CVD method, a void was liable to be formed on the GaAs surface because the tungsten layer was not sufficiently grown on the exposed GaAs surface. This problem can be solved by forming a SiO₂ coating on the side wall of the hole to cover the peripheral GaAs surface, and then growing tungsten according to the selective CVD method.

EXAMPLE 2

In this Example, aluminum was buried in the contact hole 112 by making use of an organic aluminum as opposed to Example 1 wherein tungsten was buried in the contact hole 112. Further, a SiN layer was used instead of the SiO₂ layer Aluminum provided a lower resistance than that of tungsten and contributed to an improvement in the device performance. The selective CVD method could be conducted though the SiN layer was used instead of the SiO₂ layer.

EXAMPLE 3

In this Example, copper was selectively buried in the contact hole 112 by making use of copper nitrate as opposed to Example 1 wherein tungsten was buried in the contact hole 112. In this Example, copper nitrate, $Cu(NO_3)_2$, gas and carbon monoxide (or hydrogen) were used under conditions of a flow rate ratio of 1:10 and a gas pressure of 0.1 Torr. The substrate was heated at 300° C. or above. Since copper has both a low resistance and a high electromigration resistance, it contributes to an improvement in the device performance and reliability.

EXAMPLE 4

An n+-type InGaAs subcollector layer doped with an impurity of $5 \times 10^{18}$ cm$^{-3}$ was used instead of the n+-type GaAs subcollector layer 12 used in Example 1. Since the InGaAs layer can be more heavily doped than the GaAs layer, a non-alloy ohmic contact can be formed with tungsten or the like. Therefore, in the present Example, it was unnecessary to use the AuGe electrode/tungsten coating 113 and the hole side wall SiO₂ 52 used to form an ohmic contact in Example 1.

EXAMPLE 5

As opposed to Example 4 wherein a collector layer, a base layer and an emitter layer was formed in that order on the substrate, in the present Example, as shown in FIGS. 3(a) to 3(f), an n+-type InGaAs subemitter layer 31 (5000 Å), an n -type graded InGaAs subemitter layer 32 (500 Å), an n-type AlGaAs emitter layer 33 (2000 Å), a p+-type GaAs base layer 34 (1000 Å), an n-type GaAs collector layer 35 (4000 Å), and an n+-type GaAs cap layer 36 (2000Å) were formed in that order on a semiinsulating GaAs substrate 30. Thereafter, a SiN layer mask 37 corresponding to the shape of the emitter was formed by a combination of usual CVD and lithography techniques [see FIG. 3(a)], and an unnecessary n+-type GaAs cap layer 36 was removed by etching. Ion implantation of p-type impurities, such as Mg or Be, was conducted, and flash annealing was applied by making use of infrared rays to form a p+-type external base layer 38 [see FIG. 3(b)]. A device isolation region 39 and a base-emitter isolation region 310 were formed respectively through ion implantation of H+ and B+ by making use of a mask comprising a photoresist [see FIG. 3(c)]. A SiO₂ layer 311 was applied thereon to form a mask pattern. Thereafter, a collector contact hole 312 reaching the n+-type subemitter layer 31 was formed by making use of a chlorine-base gas [see FIG. 3(d)]. The contact hole 312 was completely filled with tungsten 313 according to the selective CVD method [FIG. 3(e)]. Then, a collector electrode 314 and a base electrode 315 were formed by a combination of the usual lithography technique with the lift-off method. Since the n+-type InGaAs subemitter layer 31 was used in the present Example, it was possible to establish a non-alloy ohmic contact with a buried metal such as tungsten. Further, since an HBT having the above-described structure has small series resistance and parasitic capacitance between the base and the collector, it is possible to attain high-speed operation.

EXAMPLE 6

Figure 4A:
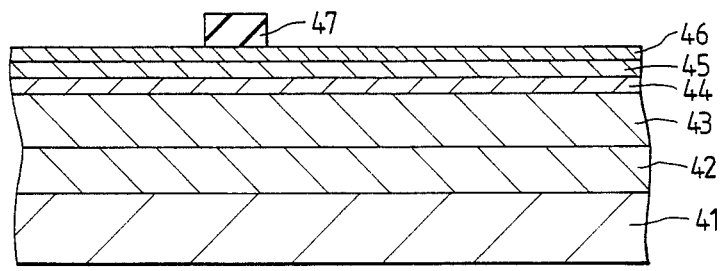
FIG. 4 is a schematic process diagram of Example 6.
Figure 4B:
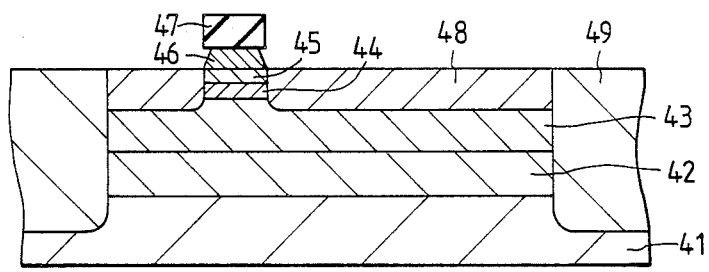

As opposed to Example 1 wherein a base-collector isolation region was formed through ion implantation of B+, in the present Example, the base-collector isolation was performed by covering the side wall of the contact hole with a dielectric layer. The present Example will now be described in detail with reference to FIG. 4. The same HBT structure as that of Example 1 was grown by the MBE method. Thereafter, a SiN layer mask 47 corresponding to the emitter pattern was formed by a combination of the usual CVD and lithography techniques [see FIG. 4(a)], and an unnecessary n+-type GaAs cap layer 46 was removed by etching. Ion implantation of p-type impurities, such as Mg or Be, was conducted, and flash annealing was then applied to form a p+-type external base layer 48. Then, a device isolation region 49 was formed by ion implantation of H+ [see FIG. 4(b)].

Figure 4C:
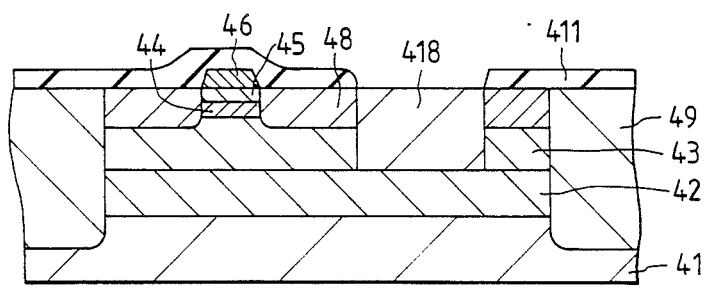
Figure 4D:
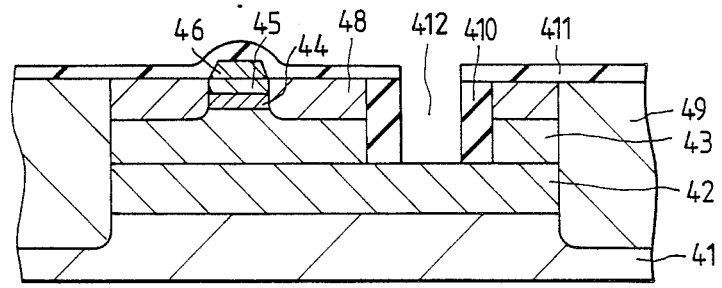
Figure 4E:
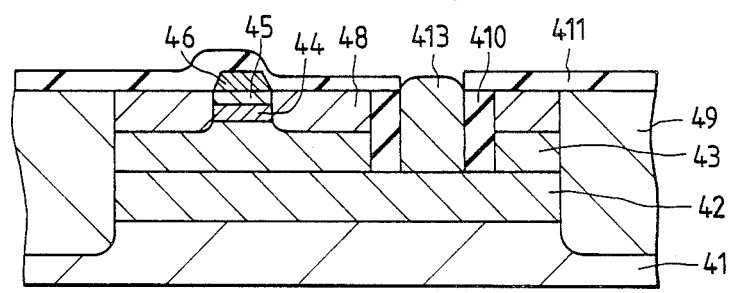
Figure 4F:
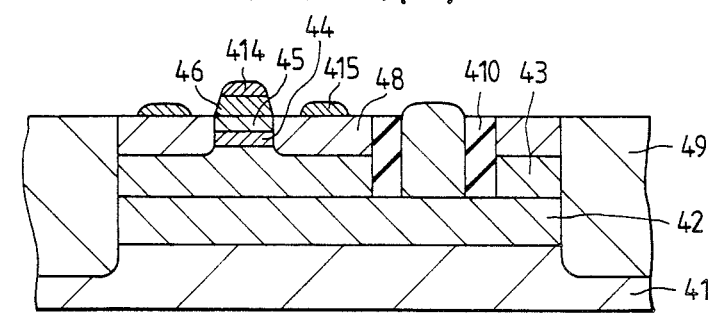
Figure 5A:
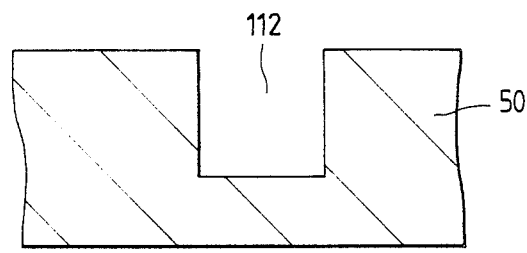
FIG. 5 is an explanatory cross-sectional view of part of the process used in Examples 1 and 6.
Figure 5B:
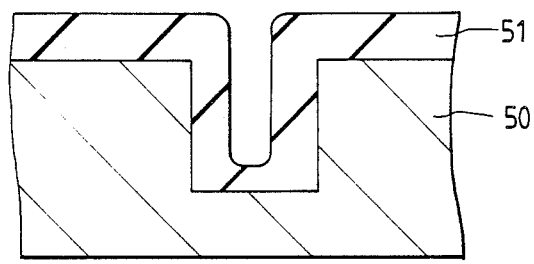
Figure 5C:
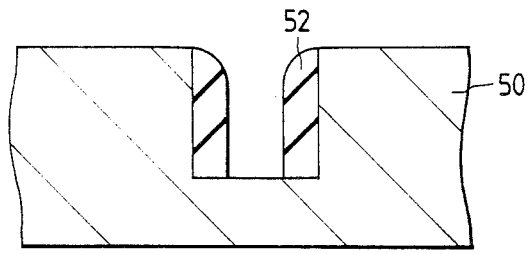

A hole was formed so as to reach the n+-type GaAs subcollector layer 42 according to the RIE method by making use of a photoresist as a mask and a chlorine-base gas, and SOG or PIQ 410 was buried in the hole [FIG. 4(c)]. Subsequently, the SiO$_2$ layer 411 was applied over the whole surface, and a contact hole 412 was formed through the above-described SOG layer 410 by the RIE method by making use of a resist as a mask. Tungsten 413 was then buried in the contact hole 412 by the selective CVD method [see FIG. 4(d)]. Thereafter, an emitter electrode 414 and a base electrode 415 were formed in the same manner as that of Example 1. In the present Example, the side wall of the contact hole 412 was covered with the dielectric layer 410, so that the metal could be buried with high controllability. Although in the present Example, the application of the dielectric layer to the side wall of a hole to be filled with a metal was conducted by removing a dielectric layer which had been buried, it is also possible to form the same side wall SiO$_2$ layer 52 as that shown in FIG. 4(d) by a process shown in FIG. 5 which comprises applying a SiO$_2$ layer 51 to the GaAs layer 50 having a hole according to the LPCVD method and subjecting the SiO$_2$ to anisotropic etching according to the well-known RIE method. FIGS. 5(a) to (c) are explanatory views of a method of side wall SiO$_2$ layer A structure shown in FIG. 5(c) can be realized by applying a SiO$_2$ coating 51 on the whole surface of the GaAs layer (or substrate) 50 [see FIG. 5 (b)] and then subjecting the SiO$_2$ layer to etching.

It is needless to say that the present Example can be applied to the above-described Examples 1 to 5 as well.

According to the present invention, a metal can be buried in a collector contact hole having a small electrode area, which makes it possible to provide HBT having a small device area and a planar structure with high productivity.

What is claimed is:

1. A process for fabricating a heterojunction bipolar transistor comprising:
    a step of successively growing semiconductor layers serving as a subcollector, a collector, a base, and an emitter, respectively, through epitaxial growth on a compound semiconductor substrate in such a manner that at least one of the emitter junction and collector junction is a heterojunction, wherein said subcollector layer is a heavily doped InGaAs layer;
    a step of establishing base contact through ion implantation;
    a step of forming a dielectric material in a collector electrode drawing-out region;
    a step of forming a dielectric layer on the surface of said epitaxial surface; and
    a step of etching part of said dielectric layer and said dielectric material formed in said collector electrode drawing-out region to form a hole reaching the surface of said subcollector and burying a metal serving as a collector electrode in said hole according to the selective CVD method.

2. A process for fabricating a heterojunction bipolar transistor according to claim 1, wherein a metal to be buried is at least one member selected from among tungsten, aluminum, and copper.

3. A process for preparing a heterojunction bipolar transistor comprising:
    a step of successively growing semiconductor layers serving as subcollector, a collector, a base, and an emitter, respectively, through epitaxial growth on a compound semiconductor substrate in such a manner that least one of the emitter junction and collector junction is a heterojunction, wherein said subcollector layer comprises a heavily doped InGaAs layer;
    a step of forming an external base through ion implantation;
    a step of forming a dielectric layer on the surface of said epitaxial surface;
    a step of etching part of said dielectric layer and a collector electrode drawing-out region to form a hole reaching the surface of said subcollector and forming a SiO$_2$ layer only on the side wall of said hole; and
    a step of burying a metal serving as a collector electrode according to the selective CVD method.

4. A process for fabricating a heterojunction bipolar transistor according to claim 3, wherein said metal serving as a collector electrode is a member selected from among tungsten, aluminum, and copper.

5. A process for fabricating a heterojunction bipolar transistor, comprising:
    a step of successively growing semiconductor layers serving as a subcollector, a collector, a base, and an emitter, respectively, through epitaxial growth on a compound semiconductor substrate in such a manner that at least one of the emitter junction and collector junction is a heterojunction;
    a step of forming an external base through ion implantation;
    a step of forming a dielectric layer on the surface of the epitaxially grown semiconductor layers;
    a step of etching part of said dielectric layer and a collector electrode drawing-out region to form a hole reaching the surface of said subcollector and forming a first electrode on the surface of said exposed subcollector by a lift-off method;
    a step of forming a side wall dielectric layer; and
    a step of burying a metal serving as a collector electrode in said hole according to the selective CVD method, wherein said first electrode comprises a layer of AuGe formed on the surface of said exposed subcollector and a layer of W formed on said layer of AuGe.

6. A process for fabricating a heterojunction bipolar transistor according to claim 5, wherein said side wall dielectric layer is made of a material selected from the group consisting of SiO$_2$ and SiN.

7. A process for fabricating a heterojunction bipolar transistor according to claim 6, wherein said side wall dielectric layer is made of SiO$_2$.

8. A process for fabricating a heterojunction bipolar transistor according to claim 6, wherein said side wall dielectric layer is made of SiN.

9. A process for fabricating a heterojunction bipolar transistor comprising:
    a step of successively growing semiconductor layers serving as a subcollector, a collector, a base, and an emitter, respectively, through epitaxial growth on a compound semiconductor substrate in such a manner that at least one of the emitter junction and collector junction is a heterojunction;

a step of forming an external base through ion implantation;

a step of forming a dielectric material in a collector electrode drawing-out region;

a step of forming a dielectric layer on the surface of the epitaxially grown semiconductor layers;

a step of etching part of said dielectric layer and said dielectric material formed in said collector electrode drawing-out region to form a hole reaching the surface of said subcollector and forming a first electrode on the surface of said exposed subcollector by a lift-off method; and a step of forming a side wall dielectric layer only in the peripheral portion of said first electrode formed within said hole and burying a metal serving as a collector electrode according to the selective CVD method, wherein said first electrode comprises a layer of AuGe formed on the surface of said exposed subcollector and a layer of W formed on said layer of AuGe.

10. A process for fabricating a heterojunction bipolar transistor according to claim 9, wherein said side wall dielectric layer is made of a material selected from the group consisting of $SiO_2$ and SiN.

11. A process for fabricating a heterojunction bipolar transistor according to claim 10, wherein said side wall dielectric layer is made of $SiO_2$.

12. A process for fabricating a heterojunction bipolar transistor according to claim 10, wherein said side wall dielectric layer is made of SiN.

13. A process for fabricating a heterojunction bipolar transistor according to claim 9, wherein said step of forming a dielectric material comprises ion implanting $H^+$ and $B^+$ into said collector electrode drawing-out region.

14. A process for preparing a heterojunction bipolar transistor comprising:

a step of successively growing semiconductor layers serving as a subcollector, a collector, a base, and an emitter, respectively, through epitaxial growth on a compound semiconductor substrate in such a manner that least one of the emitter junction and collector junction is a heterojunction, wherein said subcollector layer comprises a heavily doped InGaAs layer;

a step of forming an external base through ion implantation;

a step of forming a dielectric layer on the surface of said epitaxial surface;

a step of etching part of said dielectric layer and a collector electrode drawing-out region to form a hole reaching the surface of said subcollector and forming a dielectric side wall layer only on the side wall of said hole; and a step of burying a metal serving as a collector electrode according to the selective CVD method.

* * * * *